(12) United States Patent
Nelson et al.

(10) Patent No.: US 12,306,681 B2
(45) Date of Patent: May 20, 2025

(54) DATA STORAGE SYSTEM WITH PARALLEL ARRAY OF DENSE MEMORY CARDS AND HIGH AIRFLOW

(71) Applicant: SK HYNIX NAND PRODUCT SOLUTIONS CORP., Rancho Cordova, CA (US)

(72) Inventors: Michael D. Nelson, Mountain View, CA (US); Jawad B. Khan, Cornelius, OR (US); Randall K. Webb, Portland, OR (US); Knut S. Grimsrud, Forest Grove, OR (US); Wayne J. Allen, Beaverton, OR (US)

(73) Assignee: SK HYNIX NAND PRODUCT SOLUTIONS CORP., Rancho Gordova, CA (US)

( * ) Notice: Subject to any disclaimer, the term of this patent is extended or adjusted under 35 U.S.C. 154(b) by 453 days.

(21) Appl. No.: 16/946,739

(22) Filed: Jul. 2, 2020

(65) Prior Publication Data

US 2020/0333859 A1   Oct. 22, 2020

Related U.S. Application Data

(63) Continuation of application No. 15/068,827, filed on Mar. 14, 2016, now abandoned.

(51) Int. Cl.
*G06F 1/20* (2006.01)
*H05K 7/14* (2006.01)

(52) U.S. Cl.
CPC ............ *G06F 1/20* (2013.01); *H05K 7/1439* (2013.01); *H05K 7/1452* (2013.01); *H05K 7/1457* (2013.01)

(58) Field of Classification Search
CPC ...... G06F 1/20; H05K 7/1457; H05K 7/1439; H05K 7/1452; H05K 7/1487
See application file for complete search history.

(56) References Cited

U.S. PATENT DOCUMENTS

| 5,398,161 A | * | 3/1995 | Roy | ................... H05K 7/20545 |
| | | | | 361/752 |
| 6,325,636 B1 | * | 12/2001 | Hipp | ...................... G06F 1/183 |
| | | | | 361/788 |

(Continued)

OTHER PUBLICATIONS

Taiwan Patent Office; Office Action and Search Report issued in TW Patent Application No. 106102396, dated Nov. 10, 2020; 11 pages including partial English translation.

*Primary Examiner* — Rockshana D Chowdhury
(74) *Attorney, Agent, or Firm* — Haley Guiliano LLP

(57) ABSTRACT

A data storage system with a parallel array of dense memory cards and high airflow is described. In one example, a rack-mount enclosure has a horizontal plane board with memory connectors and external interfaces. Memory cards each have a connector to connect to a respective memory connector of the horizontal plane board, each memory card extending parallel to each other memory card from the front of the enclosure and extending orthogonally from the first side of the horizontal plane board. A power supply proximate the rear of the enclosure and the first side of the horizontal plane board provides power to the memory cards through the memory card connectors and has a fan to pull air from the front of the enclosure between the memory cards and to push air out the rear of the enclosure.

20 Claims, 7 Drawing Sheets

(56) References Cited

U.S. PATENT DOCUMENTS

| | | | | |
|---|---|---|---|---|
| 7,443,695 B2* | 10/2008 | Roscoe | | H05K 7/1408 |
| | | | | 361/756 |
| 8,045,328 B1* | 10/2011 | Chen | | H05K 7/20727 |
| | | | | 361/679.48 |
| 8,116,078 B2* | 2/2012 | Xu | | G06F 1/181 |
| | | | | 361/721 |
| 8,154,867 B2* | 4/2012 | Shearman | | H05K 7/20572 |
| | | | | 361/679.48 |
| 8,547,825 B2* | 10/2013 | Armstrong | | H04L 41/0659 |
| | | | | 370/242 |
| 8,843,771 B2* | 9/2014 | Wang | | H04L 41/00 |
| | | | | 702/132 |
| 9,095,070 B2* | 7/2015 | Ross | | H05K 7/1489 |
| 9,213,485 B1* | 12/2015 | Hayes | | G06F 3/0611 |
| 9,277,680 B2* | 3/2016 | Roesner | | H05K 7/20736 |
| 10,356,934 B2* | 7/2019 | Ni | | G06F 1/188 |
| 2004/0073834 A1* | 4/2004 | Kermaani | | G06F 11/2028 |
| | | | | 714/13 |
| 2005/0259397 A1* | 11/2005 | Bash | | H05K 7/20772 |
| | | | | 361/699 |
| 2009/0144568 A1* | 6/2009 | Fung | | G06F 1/324 |
| | | | | 713/300 |
| 2010/0090663 A1* | 4/2010 | Pappas | | H01G 11/08 |
| | | | | 320/166 |
| 2013/0013956 A1* | 1/2013 | Armstrong | | G06F 11/07 |
| | | | | 714/4.12 |
| 2013/0077223 A1* | 3/2013 | Xu | | G06F 1/20 |
| | | | | 361/679.4 |
| 2014/0016268 A1* | 1/2014 | Tsujimura | | G06F 1/20 |
| | | | | 361/695 |
| 2014/0063721 A1* | 3/2014 | Herman | | H05K 7/1487 |
| | | | | 236/47 |
| 2014/0362515 A1* | 12/2014 | Pronozuk | | H05K 7/1487 |
| | | | | 361/679.48 |

* cited by examiner

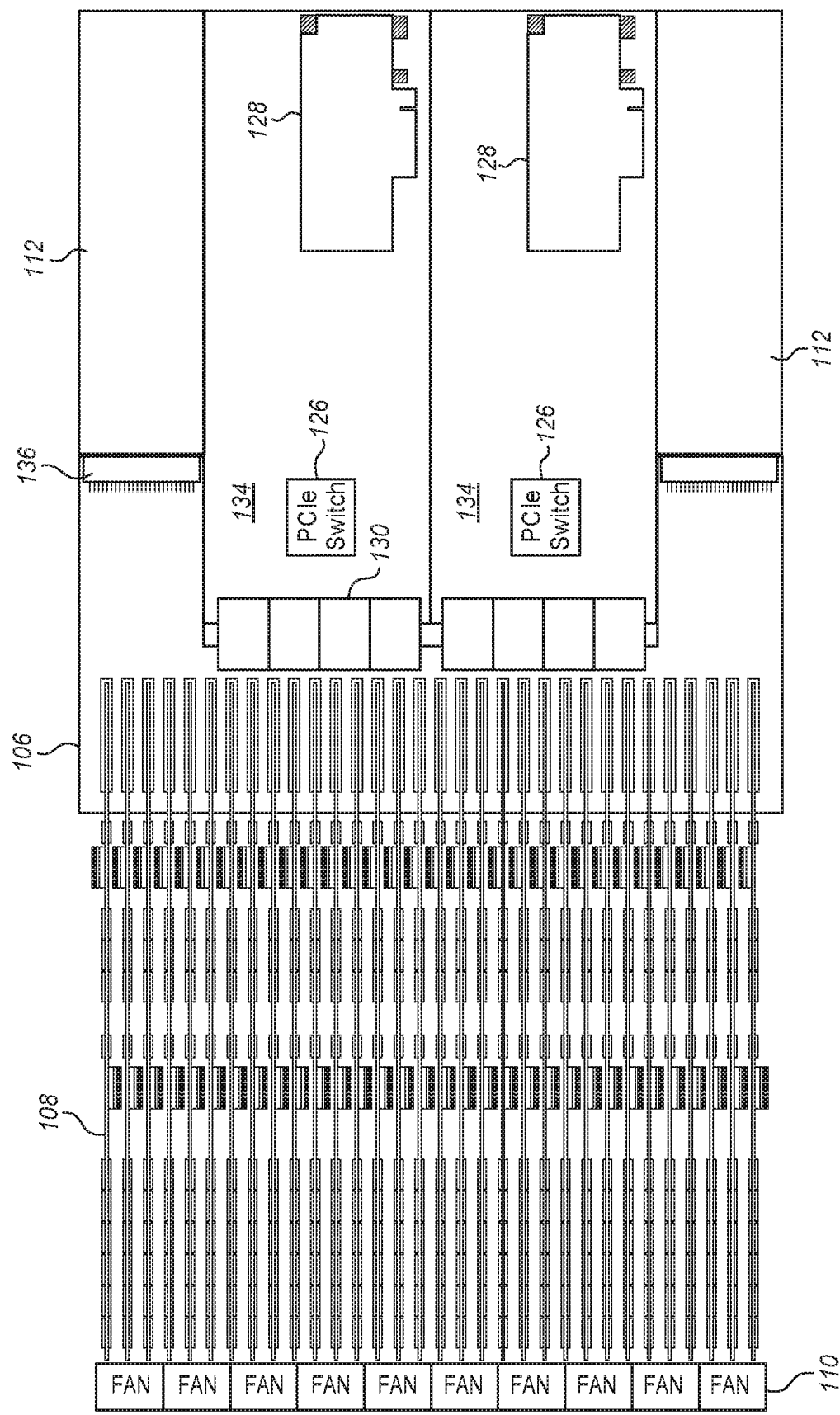

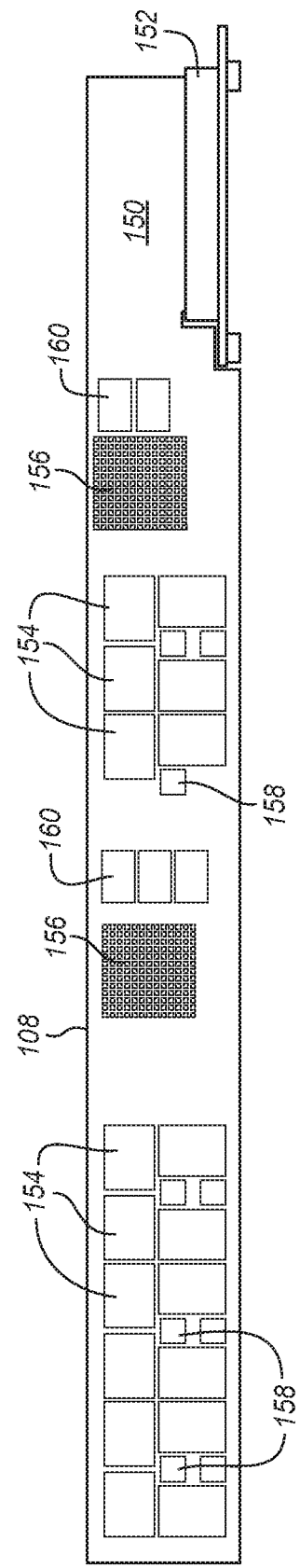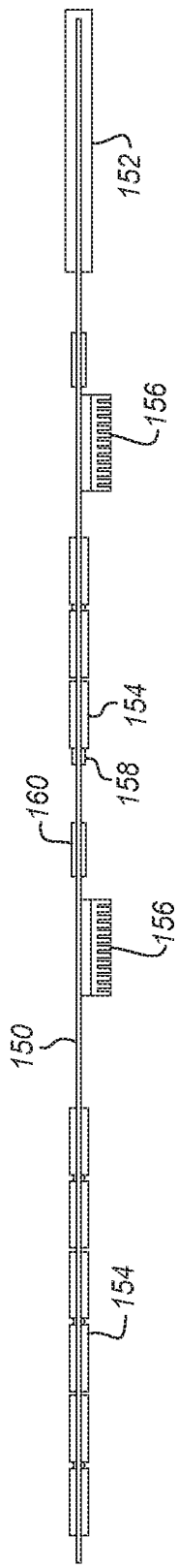

DATA STORAGE SYSTEM WITH PARALLEL ARRAY OF DENSE MEMORY CARDS AND HIGH AIRFLOW

CROSS-REFERENCE TO RELATED APPLICATIONS

This Application is a continuation (and claims the benefit of priority under 35 U.S.C. § 120) of U.S. patent application Ser. No. 15/068,827, filed Mar. 14, 2016, and entitled "Data Storage System with Parallel Array of Dense Memory Cards and High Airflow". The disclosure of the prior application is considered part of and is hereby incorporated by reference in its entirety in the disclosure of this application.

FIELD

The present description pertains to the field of data storage systems, and in particular to a system with an array of memory cards.

BACKGROUND

High capacity, high speed, and low power memory is in demand for many different high powered computing systems, such as servers, entertainment distribution head ends for music and video distribution and broadcast, and super computers for scientific, prediction, and modeling systems. The leading approach to provide this memory is to mount a large number of spinning disk hard drives in a rack mounted chassis. The chassis has a backplane to connect to each hard drive and to connect the hard drives to other rack mounted chassis for computation or communication. The hard disk drives connect using SAS (Serial Attached SCSI (Small Computer System Interface)), SATA (Serial Advanced Technology Attachment), or PCIe (Peripheral Component Interface express) or other storage interfaces.

While the spinning disk hard drive provides a large amount of storage at low cost, it has a high power consumption and high heat production. This is not significant for desktop computers with a single drive but when hundreds or thousands of drives are combined, then the power required to drive and cool the disks can be significant. NAND flash drive prices are coming down steadily while reliability and longevity is being improved. As a result, for many applications an AFA (All Flash Array) is used for either warm or cold storage applications or both.

Flash arrays are constructed at high volume in a 2.5" hard disk drive form factor and in a M.2 module form factor. These form factors have been specifically developed for notebook computers and provide an amount of storage, speed, power consumption and cost that is best suited for notebook computers. An AFA could be built using these standard form factor SSDs (Solid State Drives). When off the shelf 2.5" SSDs are used for a large capacity solution and they are vertically mounted there is a minimum rack-mount chassis size of 2U or 3U due to the size of the drives, the mounting connectors and the need for airflow. M.2 SSDs have a lower capacity and so require many more devices and connectors.

BRIEF DESCRIPTION OF THE DRAWINGS

Embodiments are illustrated by way of example, and not by way of limitation, in the figures of the accompanying drawings in which like reference numerals refer to similar elements.

FIG. 3 is a top plan view of a memory system with a top cover removed according to an embodiment.

FIG. 4 is a side plan view of a memory card according to an embodiment.

FIG. 5 is a top plan view of the memory card of FIG. 4.

DETAILED DESCRIPTION

A memory system is described that provides dense All Flash Array (AFA) designs. The system has front or top serviceability of an array of flash storage modules, as well as excellent airflow characteristics. In the case of a top serviceable model a cable management solution is used at the back for sliding the chassis out of the rack. Front serviceable storage modules avoid the need for the chassis has to be slid out of the rack because there is no need to open the top cover to service the storage modules. Yet the system may still be mounted to a sliding carrier to allow for other modules to be serviced without removing the chassis, such as fans, interconnects, controllers, switches, and computing modules.

As described dense memory storage boxes have high airflow, heat dissipation and storage density using a thin and long SSD form factor. This SSD will be referred to herein as a "Ruler Storage Module", "RSM" or "ruler". Several RSMs may be used in a 19" wide rack-mount SSD system. They may be placed in a single row multiple column arrangement, which helps guide the airflow and provides maximum surface area for the NAND media.

Figure 1:
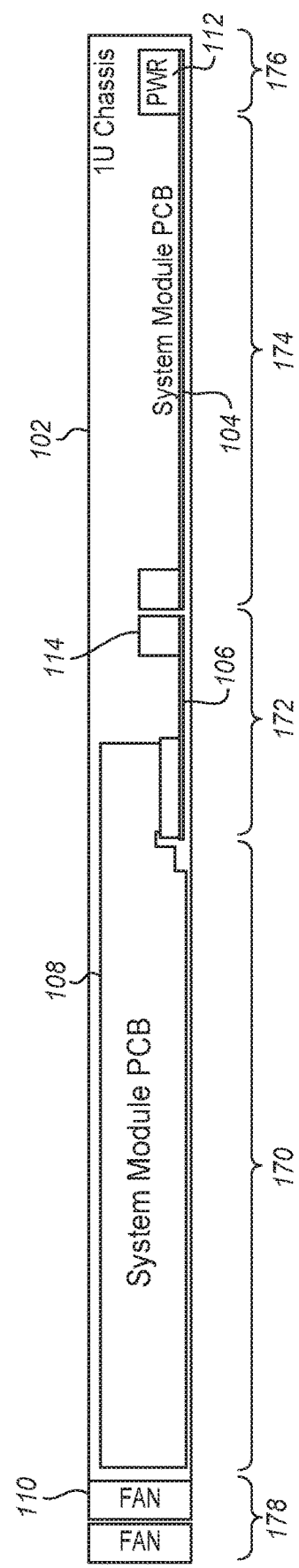
FIG. 1 cross-sectional side view diagram of memory system according to an embodiment.

FIG. 1 is a cross-sectional side view diagram of an example of a rack-mount chassis and enclosure to accommodate the RSM's as described herein. The system has an enclosure 102 which in this case is a 1U height rack mount enclosure. The enclosure is configured to mount in a particular type of standardized rack that has airflow from the front or left as shown in the diagram to the rear or right as shown in the diagram. The rear is configured for cabling. The enclosure is about 19" (483 mm) wide and 33" (840 mm) deep. The 1U form factor is 1.75" (44 mm) high. However, the particular width, height, and airflow direction may be adapted to suit other form factors.

The enclosure 102 carries a system module PCB (printed circuit board) 104 proximate the rear of the enclosure, a midplane PCB 106 near the middle of the enclosure and an array of RSMs 108 proximate the front of the enclosure. An array of fans 110 is mounted to the front of the enclosure to draw air into the enclosure and push it between and across the RSMs and to the rear of the enclosure. One or more power supplies 112 are mounted at the rear of the enclosure and may also have fans to draw air from the enclosure and push it out the rear of the enclosure. There may be additional fans along the chassis from front to rear. Rear fans may be used to pull air from the front across the chassis. Fans may be used in the middle of the chassis in addition to or instead of the front or rear fans to pull air in from the front and push it out the rear.

The configuration may be considered to have three zones a front memory zone 170 that in this example is about 16" (400 mm) deep, a central midplane zone 172 that is about 8" (200 mm) deep and a rear power supply and compute zone 174 that is also about 8" (200 mm) deep. The relative sizes of these zones may be adapted to suit different configurations. The memory array consumes about half of the enclosure so that the rear half of the enclosure may be configured to suit different applications of the system.

In the memory card zone 170, the parallel memory cards extend from a position proximate the front of the enclosure toward the rear of the enclosure. This is followed by the switching zone 172 proximate the front of the enclosure and connected to the memory cards to carry a switch fabric. This is where the midplane lies. The rear zone 174 has power supply and management between the memory card zone and a rear of the enclosure. This zone may also be the switch zone that carries the switch fabric. In this case the midplane carries only a connector matrix to couple the power supply and management zone to the memory card zone. This middle zone may also be a compute zone which performs computations using values stored in the memory card zone.

The system may also be considered to have a rear fan zone 176 between the power supply and management zone and the rear of the enclosure to pull air from the memory card zone out the rear of the enclosure. The rear fan zone cooperates with a front fan zone 178 between the memory cards and the front of the enclosure to push air from outside the enclosure to the memory card zone.

The front fans and the rear power supply provide a push of air from the front and a pull of air from the rear to establish air flow across the RSMs, the midplane and the system module. The number and arrangement of the fans may be modified to suit the cooling and module requirements of the system. The system may have no front fans or no power supply fans and rely only on the push or the pull or both. While common power supplies include fans, the power supplies may not have fans. Instead separate rear fans may be used. Additional rear fans may be used to supplement the pull of the power supply fans. In some embodiments, the power supplies are provided in a separate enclosure and rear fans may be used without power supplies.

The system module 104 may be provided to suit different requirements, depending on the intended use of the system. The system module may be a data interface or a switching interface to connect the RSMs to external connectors through wired or wireless interfaces. It may include a memory controller to manage access to the RSMs and provide memory management and maintenance. It may include a data processing system to provide server, computing, and other functions between the RSMs and external devices.

The midplane 106 provides a connection between the RSM's and the system module, including a power interface to the RSMs. The midplane may also provide memory management and mapping between the RSMs and the system module. As shown, the mid plane PCB is mounted horizontally and orthogonal to the RSMs. The horizontal orientation of the mid-plane eliminates the need to design cavities into the mid-plane to accommodate air flow. This greatly simplifies mid-plane design and signal routing.

The RSMs 108 contain all the flash memory, such as NAND flash and the memory controllers that are needed to store user data. Each RSM also works as part of an airflow channel for guiding the air that is blown in by the front mounted fans and blown out by the fans in the power supplies in a push-pull model. By using thin and long form factor SSDs in a single row format, the surface area of the SSD card is maximized, with excellent airflow characteristics.

With the vertical and parallel flash modules extending orthogonal to the midplane, the storage may be very dense. All the area is being effectively used, with excellent airflow characteristics. Using 32 RSMs with 32 TB capacity in a 19" SSD enclosure, the system could have a storage density of up to 1 PetaByte in a 1U height rack chassis. Emerging 3D NAND chips allow for 1 TB of NAND memory on a single chip. By placing 18 such chips on each side of each RSM and placing 32 RSMs in the enclosure a 1U 19" Storage system can replace two full racks of 1 TB HDDs. The parallel orthogonal RSM configuration allows for very tight RSM-to-RSM spacing so that more RSMs may be fit into a single chassis system enclosure while maintaining very good air flow for system cooling.

Figure 2:
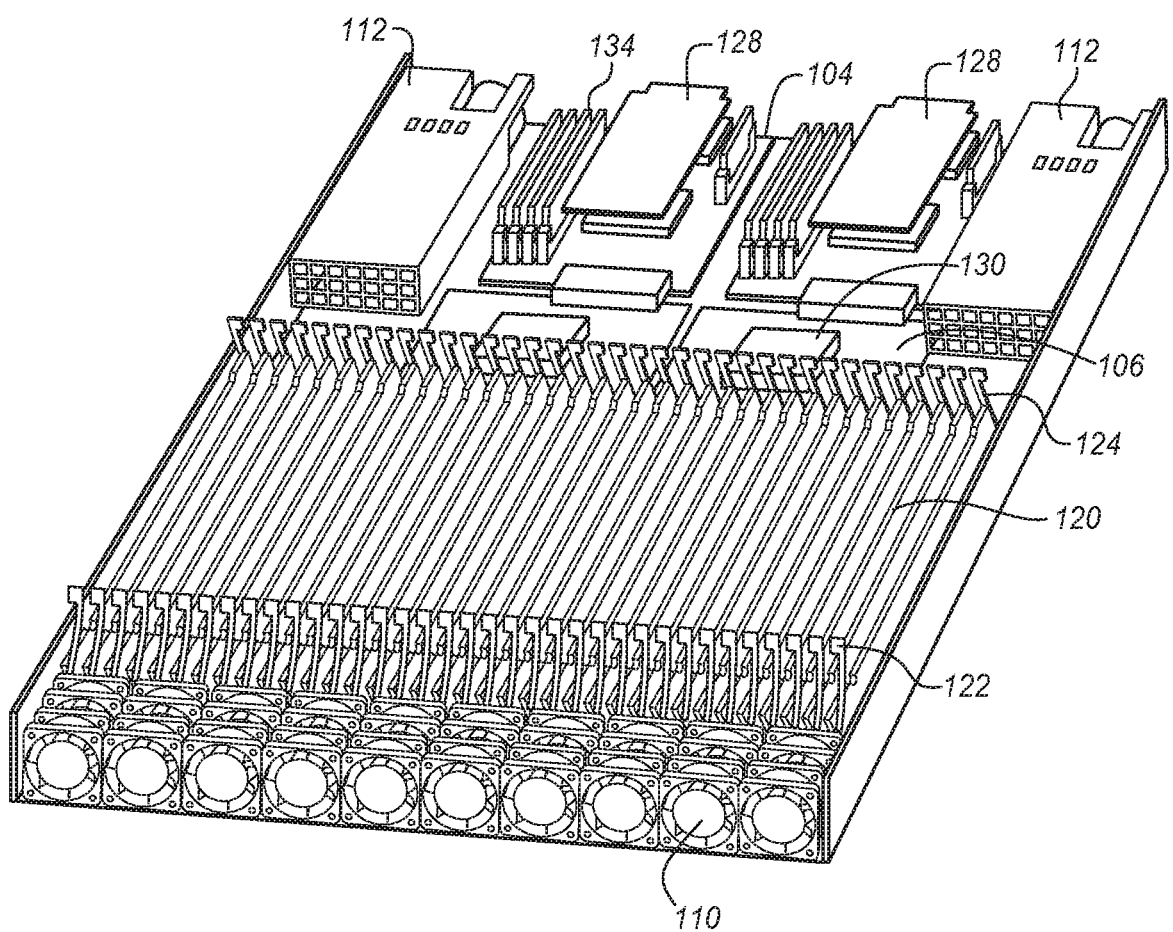
FIG. 2 is an isometric view of a memory system with a top cover removed according to an embodiment.

FIG. 2 is an isometric view diagram of the system of FIG. 1 with the top cover of the enclosure removed. There are several fans 110 in the front pulling air from outside, followed by 32 slots 120 for Ruler SSDs 108 (not shown), and followed by modular connectivity and compute modules at the back. There are two redundant power supplies 112 on the sides at the back of the enclosure. These power supplies have fans which are pushing air out of the box.

The slots 120 have front 122 and rear 124 latches, levers, or clips to hold each RSM in place. The slots are attached to the midplane and have connectors near the rear for data communications and power with the midplane. Because the slot connectors are in the horizontal midplane and connect to the bottom edge of the RSMs, the connectors do not interfere with airflow between the RSMs. The clips rotate to hold the RSMs in place against the slots. There are a variety of other types of connectors that may be used for the RSMs.

The system board 104 in this example is an interchangeable component that may be selected for different connection configurations. In this case there are two system boards. Each one has a switching complex 134 to provide switching between the different RSMs and an interface 128 that provides connections to external components. The interface may take any of a variety of different forms depending on the system needs. The interface may be a network interface, a storage array interface, or a direct memory connection interface.

PCIe (Peripheral Component Interconnect express) interconnect with an NVMe (Non-Volatile Memory express) storage protocol may be supported by the switching fabric 134 and the external interface 128. In this case, the NVMe is supported at the external interface and may also be supported in the connection to each RSM as well as within each RSM. Other PCIe interconnect protocols may alternatively be used. In addition SAS (Serial Attached Small computer system interface), SATA (Serial Advanced Technology Attachment), or other related, similar or different storage protocols may be used.

FIG. 3 is a top view diagram of a variation of the memory system of FIG. 2. A high level architecture is shown of a variation of a 19" SSD. The array of fans 110 are at the front of the enclosure and blow air across the array of SSDs 108. In this example there are 10 fans to blow air across 32 SSD memory cards. The precise number of fans may be adapted to suit the dimensions of the enclosure and particular type and configuration of fan and any other guides, shrouds, or other structures. The cards are placed vertically and aligned to be parallel to each other. The cards connect to a midplane 106 that has 32 connectors, one for each card. The connectors are at the rear end of the card. The connector may take a variety of different forms. The midplane is connected to a system module. The system module PCB is not visible in this view because it is covered by other components.

The midplane is coupled through a power connector 136 on left and right sides of the midplane (top and bottom as shown) to a left and right side power supply 112. These power supplies may be complementary or redundant and the midplane may be wired so that both power supplies are coupled to each RSM.

The midplane base board is also coupled through an array of data connectors 130 to two switching modules 134. The left module serves the 16 RSMs on the left and the right module serves the 16 RSMs on the right. The RSMs may also be cross-coupled so that each RSM is coupled to both modules or connected in any of a variety of different patterns that include various types of redundancy.

The switching modules may contain any of a variety of different components, depending on the implementation. In this example, there is a PCIe switch 126 for each module and a network interface card (NIC) 128 for each module. The NICs allow for an Ethernet connection to external components. The Ethernet connection is converted to PCIe lanes for the RSMs. Each RSM may use one or more lanes of a PCIe interface depending on the speed and the amount of data for the particular implementation. The switching modules may also include system management sensors and controllers to regulate temperature, monitor wear and failures and report status. While switching modules are shown, other types of modules may be used including server computers that use the RSMs as a memory resource.

FIG. 4 is a side plan view diagram of an RSM or memory card 108 suitable for use with the memory system as described herein. The card has a printed circuit board (PCB) structure 150 with a connector 152 to the midplane at one end. Multiple memory chips 154, in this case eighteen chips are mounted to one side of the PCB structure. There may be more or fewer depending on the application. Each memory chip generates heat with use and consumes power with read and write operations. The number of chips may be determined based on power, cost, heat, and capacity budgets. In some embodiments 3D NAND flash memory chips are used. However, other types of solid state memory may be used including PCM (Phase Change Memory), STTM (Spin Transfer Torque Memory), magnetic, polymer, and other types of memory.

The memory card further includes memory controllers 156 to control operations, manage cells, mapping, and read and write between the connector 152 and the memory chips 154. Fan out hubs 158 may be used to connect the memory controllers to the cells of each memory chip. Buffers 160 may also be used to support write, read, wear leveling, and move operations.

FIG. 5 is a top view of the memory card of FIG. 4 showing the same components. The card may be configured to support more memory chips on the other side or only one side may be used, depending on the budget for power, heat, and capacity. The memory card may have heat sinks and exposed chip package surfaces as shown, or may be covered with one or more larger heat sinks or heat spreaders as well as protective covers.

The particular configuration and arrangement of the chips may be modified to suit requirements of different chips and to match up with wiring routing layers within the PCB. The buffers may be a part of the memory controllers or in addition to those in the memory controllers. There may be additional components (not shown) for system status and management. Sensors may be mounted to the RSM to report conditions to the memory controller or through the connector to an external controller or both.

The RSM allows a large amount of NAND flash memory to be packed into a small design. In this example with 1 TB of memory per NAND chip 154, 36 TB of memory may be carried on a single memory card. This amount may be reduced for lower cost, power, and heat and still use the same form factor. The Ruler Storage Module is shown with a bottom connector. This allows modules to be replaced by removing a top cover of the chassis for top serviceable enclosure. Typical equipment racks allow the enclosure to slide forward to allow access without removing the enclosure from the rack. This same structure and system of operation may be used in this embodiment.

The Ruler Storage Module provides optimized airflow and a maximal surface area for storage media. This new storage module allows for a 1U high, extremely dense SSD solution. This new storage module form factor does not hinder airflow in the system and yet is dense enough to provide a great advantage over existing form factors that were developed for other purposes, such as 2.5" notebook drives, AIC (Advanced Industrial Computer) memory, M.2 cards, and Gum-stick memory (typical USB stick style configurations). Some of these form factors cannot be used in a 1U height enclosure in any arrangement.

The RSMs provide quick and secure connections and may be configured to be hot-swappable in some systems. Using modular compute and connectivity blocks for the 19" SSD system described herein, one can easily, without system shut-down, swap out a compute module and insert a new compute module with varying compute horse power, depending upon the storage solution requirements, within the 19" SSD enclosure. For example, a low power compute module, such as an Intel® Atom® processor-based system may be used for storage targets that need mid-range compute capabilities, such as Simple Block Mode Storage, NVMe of Fabrics, iSCSI/SER, Fiber Channel, NAS (Network Attached Storage), NFS (Network File System), SMB3 (Server Message Block), Object store, distributed file system etc. A higher performance processor on the compute module may be used for Ceph nodes, Open Stack Object, Custom Storage Services and Key/Value Stores. For very high performance, the computing module may be in a different enclosure on the same or another rack and connected using PCIe switches or another memory interface.

In addition to providing interchangeable RSMs, the same chassis and enclosure may allow for the system modules to be interchangeable. This may allow for different connectivity modules to be used. The system may be upgraded to a different storage protocol (e.g. NVMe over Fabrics RDMA (Remote Direct Memory Access), iSCSI (internet SCSI), NVMe or even Ethernet) without changing any of the RSMs. This modularity also enables two modules to be used for redundancy and fail-over in some applications (e.g. traditional enterprise storage) and a single module for other applications (e.g. cloud computing).

Figure 6:
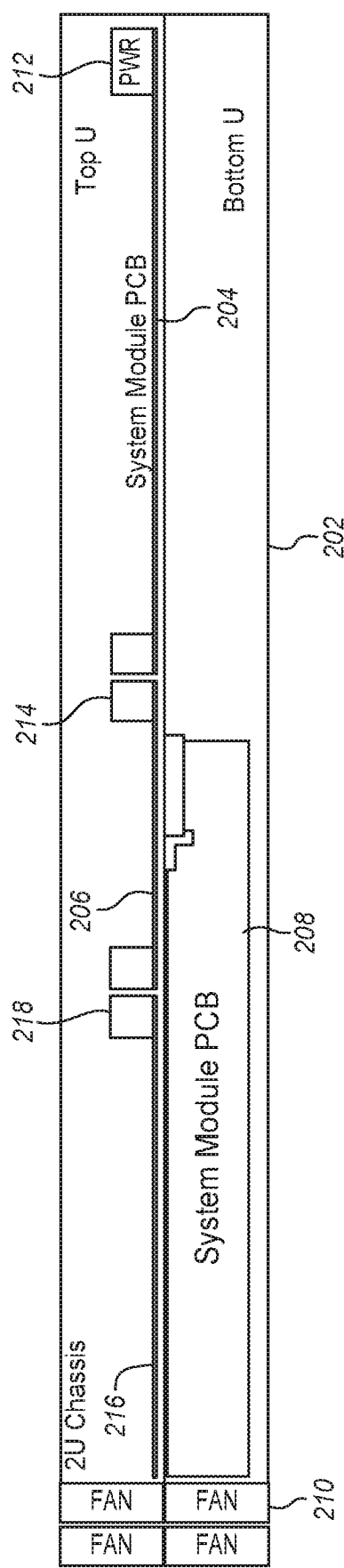
FIG. 6 is a cross-sectional side view diagram of an alternative memory system according to an embodiment.

FIG. 6 is a diagram of an alternative chassis enclosure for a 2U (3.5' or 89 mm) rack height. In this enclosure, the same memory card configuration is used for 1 PB plus of storage. The additional height allows for additional computing and switching components to be included with short fast connections to the memory. In this example, there is an array of memory cards 208 proximate the front of the enclosure coupled through connectors to a midplane PCB 206 near the center of the enclosure. The midplane is coupled through connectors 214 to a system module PCB 204 at the rear of the enclosure. There is a front fan zone with an array of fans 210 to push air across the memory cards 208 and a rear power supply 212 fastened to or adjacent to the system module PCB 204 proximate the rear of the enclosure to pull air out of the chassis.

In contrast to the 1U configuration, the system module may be on either the lower or upper side of the enclosure. The RSMs have the same configuration and therefore use only one half of the 2U chassis. In this example, the RSMs are in the lower half of the enclosure but could alternatively be in the upper half. The system module is in the upper half opposite the RSMs. Due to the PCB structure of the midplane and the system module, the PCBs are in the center of the enclosure and horizontal while the components on the PCBs extend vertically from the PCBs into the upper half of the enclosure. An additional system module (not shown) may also be added to the lower half of the enclosure at the rear of the enclosure.

The 2U configuration also allows an additional system module PCB 216 to be added at the front of the enclosure above the RSMs. As mentioned, the RSMs may be in the upper half, in which case, the additional system module may be in the lower half instead. The additional system module may be used to provide computing power or additional switch fabric. As an example, the rear system module may be used as interface, switch fabric, and power supply, while the front system module is used as a computing zone with microprocessors and memory for low power or high power computing. Alternatively, the front system module or an additional rear module may be used for PCIe adapter cards for graphics rendering, audio or video processing, or other specialized tasks.

Figure 7:
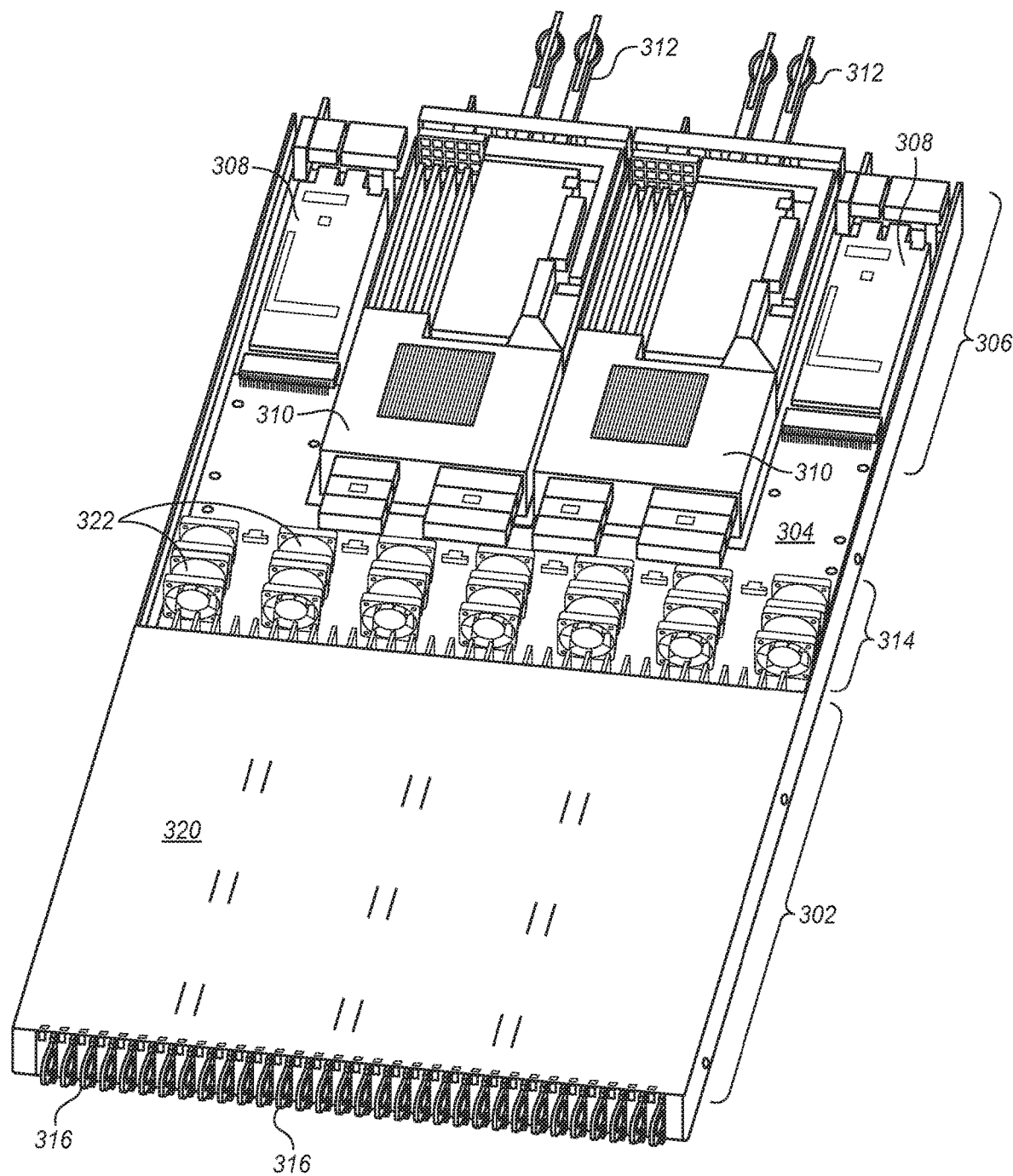
FIG. 7 is an isometric view of another alternative memory system according to an embodiment.

FIG. 7 is an isometric diagram of an alternative chassis enclosure for a 1U rack height. This configuration may be augmented by an extra layer for additional computing, switching, interface, or power supply resources. The front of the chassis has a memory ruler zone 302. In this example, the rulers are covered by a top cover 320 which may also act to guide air across and between the rulers. A horizontal plane board in the form of a midplane 304 is directly beneath and coupled to the rulers. The rulers extend orthogonally upward from the top side of the midplane. A power supply and management zone 306 includes power supplies 308 on either side of the enclosure.

Compute modules 310 are placed side-by-side between the power supplies 308 and proximate the rear of the enclosure. The compute modules include external interface components that couple to cabling 312. The cabling connects the memory system to external component on another position on the rack or to another rack. As in all of the other embodiments, the compute modules may be limited to serving and storing data and converting to and from different formats. The compute modules may be more powerful and able to perform simple tasks at low energy or more complex computation and modeling tasks, depending on the particular implementation.

A fan zone 314 is placed near the center of the enclosure with an array of fans 322 across the width of the chassis. There are seven fans in this example, but there may be more or fewer as mentioned above. The fans pull air from the front of the chassis between the memory rulers and then push it out the rear of the enclosure. They may be helped by the power supply and compute module fans, if any, and by additional rear fans, if any. The intermediate fan zone is placed between the memory rulers and the power supplies on the same side of the midplane as the memory rulers.

In this example there are no front fans shown. Front fans may be used to improve air flow or reduce the load on the middle fans. Instead the memory rulers have handles 316 at the front of the enclosure to allow access to the respective ruler. Fans may be mounted in front of these handles, in which case, the fans may be moved to access the memory rulers. The front handles allow for front access to the memory rulers without sliding the chassis forward in the rack as with the top mounted version described above.

Figure 8:
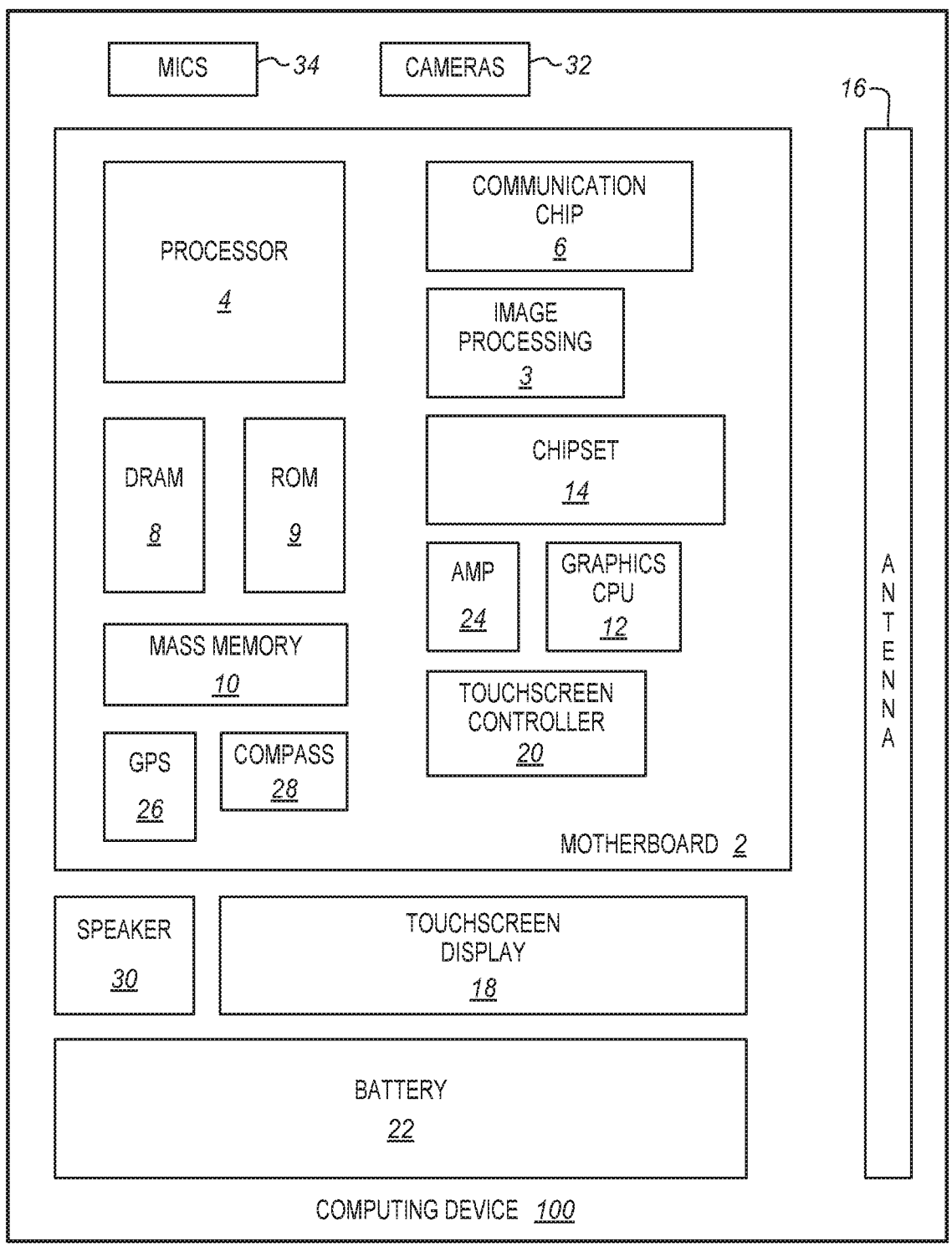
FIG. 8 is a block diagram of a computing device incorporating a memory system or capable of accessing a memory system according to an embodiment.

FIG. 8 is a block diagram of a computing device 100 in accordance with one implementation. The computing device 100 houses a system board 2. The board 2 may include a number of components, including but not limited to a processor 4 and at least one communication package 6. The communication package is coupled to one or more antennas 16. The processor 4 is physically and electrically coupled to the board 2.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, a microphone array 34, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

The computing system may be configured to be used as the system module. The computing system also reflects the entire rack-mount memory system where the mass memory is formed from multiple memory cards, as described. The memory system may have multiple iterations of the computing system within a single enclosure for each system module and also for the overall system.

In various implementations, the computing device 100 may be an entertainment front end unit or server, a music or video editing station or back end, a cloud services system, a database, or any other type of high performance or high density storage or computing system.

Embodiments may be include one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus that includes in one example, an enclosure configured to mount in a rack, the enclosure having a front configured to receive airflow and a rear configured for cabling. A horizontal plane board is in the enclosure having a plurality of memory connectors and a plurality of external interfaces, the horizontal plane board having a first side and a second opposite side. A plurality of memory cards each have a connector to connect to a respective memory connector of the horizontal plane board, each memory card extending parallel to each other memory card from the front of the enclosure and extending orthogonally from the first side of the horizontal plane board. A power supply proximate the rear of the enclosure and the first side of the horizontal plane board provides power to the memory cards through the memory card connectors and has a fan to pull air from the front of the enclosure between the memory cards and to push air out the rear of the enclosure. A cabling interface at the rear of the enclosure is coupled to the external connectors.

In further embodiments the memory cards each comprise a plurality of memory chips and a memory controller chip coupled to each of the memory chips and to the connector.

In further embodiments the memory cards each comprise an external heat sink to transfer heat from the memory chips to air flowing between the memory cards.

Further embodiments include a fan proximate the front of the enclosure to receive the airflow and push air between the memory cards to the rear of the enclosure to cool the memory cards.

Further embodiments include a fan between the memory cards and the power supply to receive the airflow, to pull air between the memory cards, and to push air to the rear of the enclosure to cool the memory cards.

In further embodiments the horizontal plane board is a midplane board, the apparatus further comprising a switching fabric interface proximate the rear of the enclosure, the switching fabric interface coupled to the external interface of the midplane board and having cabling interfaces at the rear of the enclosure.

In further embodiments the external interface of the midplane board provides multiple lanes of a peripheral component interface and wherein the switching fabric cabling interfaces comprise Ethernet cabling.

Further embodiments include a system board and a computing platform mounted to the system board and wherein the switching fabric is mounted to the system board.

In further embodiments the memory cards are above the first side of the horizontal plane board and wherein the power supply is at a level within the enclosure above the horizontal plane board to draw air across the memory cards.

In further embodiments the memory cards and the power supply are at a first level within the enclosure, the apparatus further comprising a switch fabric coupled to the memory cards and having an external cabling interface, and a computing device coupled to the switch fabric, wherein the switch fabric and the computing device are at a second level within the enclosure.

In further embodiments the horizontal plane board is between the first level and the second level.

Some embodiments pertain to a rack-mountable enclosure that includes a memory card zone proximate a front of the enclosure to carry a plurality of parallel memory cards, the cards extending from a position proximate the front of the enclosure toward the rear of the enclosure, switching zone proximate the front of the enclosure and connected to the memory cards to carry a switch fabric, and a power supply and management zone between the memory card zone and a rear of the enclosure to carry a power supply to power the memory cards and the switch fabric and a platform management controller.

Further embodiments include a rear fan zone between the power supply and management zone and the rear of the enclosure to pull air from the memory card zone out the rear of the enclosure.

Further embodiments include a front fan zone between the memory cards and the front of the enclosure to push air from outside the enclosure to the memory card zone.

Further embodiments include an intermediate fan zone between the memory cards and the power supply and management zone.

Further embodiments include a compute zone proximate the rear of the enclosure and coupled to the switch fabric to carry a computing system.

Further embodiments include a horizontal midplane board connected to the memory cards and wherein the memory cards are orthogonal to the horizontal midplane board.

Some embodiments pertain to an all flash memory array chassis that includes an enclosure configured to mount in a rack, the enclosure having a front configured to receive airflow and a rear configured for cabling, a horizontal plane board in the enclosure having a plurality of memory connectors to connect to a plurality of orthogonally mounted parallel memory cards and a plurality of external interfaces, the horizontal plane board having a first side and a second opposite side, a power supply proximate the rear of the enclosure and the first side of the horizontal plane board to provide power to the memory cards through the memory card connectors and having a fan to pull air from the front of the enclosure between the memory cards and to push air out the rear of the enclosure, a switch fabric card coupled to the external interfaces of the horizontal plane board to couple the memory cards to external devices, and a cabling interface at the rear of the switch fabric coupled to the external connectors.

Further embodiments include a plurality of fans attached to the horizontal plane board to pull air between the memory cards and to push air to the rear of the enclosure to cool the memory cards.

In further embodiments the memory cards, the switch fabric, and the power supply are at a first level within the enclosure, the apparatus further comprising a compute module coupled to the memory cards and having an external cabling interface, wherein the computing device are at a second level within the enclosure, and the horizontal plane board is between the first level and the second level.

What is claimed is:

1. A solid-state drive (SSD) enclosure, comprising:
a rigid horizontal plane printed circuit board (PCB) having a plurality of parallel slotted SSD connectors, each of the plurality of parallel slotted SSD connectors having respective latches on ends of each slotted SSD connector, and a plurality of external interfaces, the rigid horizontal plane PCB having a first side and a second side;
a plurality of SSD cards at a first level within the SSD enclosure, respectively coupled to the plurality of SSD connectors, each of the plurality of SSD cards having a ruler form factor;
a power supply at the first level within the SSD enclosure, proximate a rear of the SSD enclosure, and first side of the rigid horizontal plane PCB to provide power to the plurality of SSD cards through the plurality of SSD connectors, comprising a rear fan to pull air from a front of the SSD enclosure between the plurality of SSD cards and to push air out the rear of the SSD enclosure; and
a switch fabric coupled to the plurality of SSD cards and a computing device coupled to the switch fabric. wherein the switch fabric and the computing device are at a second level within the SSD enclosure.

2. The SSD enclosure of claim 1, wherein each SSD card extends parallel to each other SSD card from the front of the SSD and extends orthogonally from the first side of the horizontal plane PCB.

3. The SSD enclosure of claim 1, wherein the plurality of SSD cards each comprise a plurality of memory chips and a memory controller chip coupled to each of the memory chips.

4. The SSD enclosure of claim 3, wherein the plurality of SSD cards each comprise an external heat sink to transfer heat from the memory chips to air flowing between the plurality of SSD cards.

5. The SSD enclosure of claim 1, further comprising a front fan proximate the front of the SSD to receive airflow and push air between the plurality of SSD cards to the rear of the SSD to cool the plurality of SSD cards.

6. The SSD enclosure of claim 1, further comprising an intermediate fan between the plurality of SSD cards and the power supply to receive airflow, to pull air between the plurality of SSD cards, and to push air to the rear of the SSD to cool the plurality of SSD cards.

7. The SSD enclosure of claim 1, wherein the horizontal plane PCB is a midplane board, the SSD further comprising:
a switch fabric interface proximate the rear of the SSD, the switch fabric interface coupled to the plurality of external interfaces of the midplane board.

8. The SSD enclosure of claim 7, wherein the plurality of external interfaces of the midplane board provides multiple lanes of a peripheral component interface, and wherein the switch fabric interface comprises Ethernet cabling.

9. The SSD enclosure of claim 7, further comprising a system board and a computing platform mounted to the system board, and wherein the switch fabric interface is mounted to the system board.

10. The SSD enclosure of claim 1, wherein the power supply is at a level within the SSD enclosure that is above the horizonal plane PCB.

11. The SSD enclosure of claim 1, wherein the horizontal plane PCB is mounted between the first level and the second level.

12. The SSD enclosure of claim 1, wherein the plurality of SSD cards are disposed according to a 1U rack height in a single row multiple column arrangement.

13. The SSD enclosure of claim 12, wherein the 1U rack height is approximately 1.75 inches high.

14. A rack-mountable enclosure comprising:
a plurality of parallel solid-state drive (SSD) cards, proximate a front of the enclosure, having a ruler form factor, the plurality of parallel SSD cards extending from a position proximate the front of the enclosure toward a rear of the enclosure;
a switch fabric between the plurality of parallel SSD cards and the rear of the enclosure and connected to the plurality of parallel SSD cards;
a power supply to power the plurality of parallel SSD cards and the switch fabric;
a platform management controller, wherein, each of the power supply and the platform management controller is between the plurality of parallel SSD cards and the rear of the enclosure, and
an array of rear fans, between the power supply and the rear of the enclosure to pull air from the plurality of parallel SSD cards out the rear of the enclosure.

15. The enclosure of claim 14, further comprising an array of front fans between the plurality of parallel SSD cards and the front of the enclosure to push air from outside the enclosure to the plurality of parallel SSD cards.

16. The enclosure of claim 14, further comprising an array of intermediate fans between the plurality of parallel SSD cards and the power supply.

17. The enclosure of claim 14, further comprising a computing system proximate the rear of the enclosure and coupled to the switch fabric.

18. The enclosure of claim 14, further comprising a horizontal midplane board connected to the plurality of parallel SSD cards and wherein the plurality of parallel SSD cards is orthogonal to the horizontal midplane board.

19. A solid-state drive (SSD) array chassis, comprising;
an enclosure configured to mount in a rack, the enclosure having a front configured to receive airflow and a rear configured for an external cabling interface;
a rigid horizontal plane printed circuit board (PCB) having a plurality of parallel slotted SSD card connectors, each of the plurality of parallel slotted SSD connectors having respective latches on ends of each slotted SSD connector, and a plurality of external interfaces, the rigid horizontal plane PCB having a first side and a second opposite side, and wherein the horizontal plane PCB is mounted between a first level and a second level of the enclosure;
a plurality of SSD cards, respectively coupled to the plurality of SSD card connectors, each of the plurality of SSD cards at the first level within the enclosure and having a ruler form factor;
a power supply at the first level within the enclosure, proximate the rear of the enclosure, and the first side of the rigid horizontal plane PCB to provide power to the plurality of SSD cards through the plurality of SSD card connectors, comprising a rear fan to pull air from the front of the enclosure between the plurality of SSD cards and to push air out the rear of the enclosure; and
a switch fabric coupled to the plurality of SSD cards and a computing device coupled to the switch fabric, wherein the switch fabric and the computing device are at the second level within the enclosure.

20. The chassis of claim 19, further comprising a plurality of fans attached to the horizontal plane PCB to pull air between the plurality of SSD cards and to push air to the rear of the enclosure to cool the plurality of SSD cards.

* * * * *